(12) United States Patent
Lee

(10) Patent No.: US 7,489,168 B2
(45) Date of Patent: Feb. 10, 2009

(54) CLOCK SYNCHRONIZATION APPARATUS

(75) Inventor: Ki-Won Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 133 days.

(21) Appl. No.: 11/586,502

(22) Filed: Oct. 26, 2006

(65) Prior Publication Data

US 2007/0146026 A1    Jun. 28, 2007

(30) Foreign Application Priority Data

Dec. 28, 2005    (KR) ...................... 10-2005-0131385

(51) Int. Cl.
*H03L 7/06* (2006.01)

(52) U.S. Cl. ...................... 327/157; 327/158; 327/156; 327/149

(58) Field of Classification Search ......... 327/146–150, 327/156–159; 331/16, 17, 25; 375/373–376
See application file for complete search history.

(56) References Cited

U.S. PATENT DOCUMENTS

| | | | |
|---|---|---|---|
| 5,894,081 A | 4/1999 | Ashuri | |
| 5,907,253 A | 5/1999 | Davis et al. | |
| 5,945,855 A * | 8/1999 | Momtaz | ...................... 327/157 |
| 6,285,225 B1 * | 9/2001 | Chu et al. | ................... 327/158 |
| 6,373,303 B2 | 4/2002 | Akita | |
| 6,392,456 B1 * | 5/2002 | Pyeon et al. | ................. 327/156 |
| 6,714,464 B2 | 3/2004 | Bhatia et al. | |
| 6,870,410 B1 | 3/2005 | Doyle et al. | |
| 6,927,611 B2 * | 8/2005 | Rhee et al. | ................... 327/149 |
| 6,944,833 B2 * | 9/2005 | Jeon | .............................. 716/1 |
| 6,977,605 B2 | 12/2005 | Lee et al. | |
| 2004/0001364 A1 | 1/2004 | Bhatia et al. | |
| 2004/0049703 A1 | 3/2004 | Maksimovic et al. | |

FOREIGN PATENT DOCUMENTS

| | | |
|---|---|---|
| JP | 08-330955 | 12/1996 |
| JP | 10-074390 | 3/1998 |
| JP | 2005-328109 | 11/2005 |
| KR | 1020000056531 | 9/2000 |
| KR | 1020040023838 | 3/2004 |
| KR | 1020050109813 A | 11/2005 |

* cited by examiner

*Primary Examiner*—Kenneth B Wells
*Assistant Examiner*—Juan C Martinez
(74) *Attorney, Agent, or Firm*—Venable LLP; Jeffri A. Kaminski

(57) ABSTRACT

According to an embodiment of the present invention, a clock synchronization apparatus includes a delay-correcting circuit which is supplied with an initial voltage, compares a phase of an external clock with a phase of an internal clock output from a clock synchronizing unit, generates a control signal for correcting the phase of the internal clock on the basis of a difference between the phases of the external clock and the internal clock, and supplies the control signal to a replica delay unit of the clock synchronizing unit.

30 Claims, 7 Drawing Sheets

CLOCK SYNCHRONIZATION APPARATUS

BACKGROUND

1. Technical Field

The present invention relates to a clock synchronization apparatus, and more particularly, to a clock synchronization apparatus capable of reducing to a minimum a delay difference between an external clock and an internal clock of a semiconductor memory apparatus.

2. Related Art

In general, in order to perform a high-speed operation, a semiconductor memory apparatus that operates in synchronization with an external clock includes a clock buffer that receives a clock signal from the outside of the semiconductor memory apparatus and converts the received clock signal into a clock necessary for the internal operation of a chip. The use of the clock buffer causes a difference between the phases of clock signals in the apparatuses of the chip receiving clock buffer output.

When an internal clock signal is delayed by a predetermined amount of time relative to an external clock signal, the high-frequency characteristics of the semiconductor memory apparatus deteriorates. In particular, the time required to output data after the external clock is supplied, that is, an output data access time tAC is lengthened, or an error occurs. Therefore, a circuit for accurately synchronizing the phase of the internal clock signal with the phase of the external clock signal is needed to improve the high-frequency characteristics of the semiconductor memory apparatus. A delay-locked loop (DLL) or a phase-locked loop (PLL) is generally used for this purpose.

Both the DLL and PLL include a replica delay unit. The DLL includes, for example, an input buffer which receives an external clock and outputs the external clock, a delay unit which receives the clock output from the input buffer and outputs an internal clock delayed by the control of a phase-detecting unit, a replica delay unit which delays the clock signal output from the delay unit according to the modeling result of the external clock along an actual path and outputs the delayed clock signal, and a phase-detecting unit which compares the phase of a signal output from the replica delay unit with the phase of a signal output from the input buffer.

However, since the path of the clock modeled by the replica delay unit differs from the actual path of the clock, it is difficult to accurately synchronize the external clock with the internal clock even though the replica delay unit is used.

Further, when the replica delay unit is used, a large number of delay elements should be additionally provided in the replica delay unit in order to correct the distorted output data access time tAC. In order to provide suitable delay elements, a test process and a correcting process should be performed, resulting in a long development time. In this case, the delay of the clock signal can be corrected through complicated processes, but it is difficult to solve the problem of the output data access time tAC being distorted, since the semiconductor memory apparatus is greatly affected by the external environment (process, voltage, temperature; PVT).

SUMMARY

Embodiments of the present invention provide a clock synchronization apparatus capable of determining whether a delay has occurred in a signal and by how much the signal is delayed, on the basis of the difference between the phase of an external clock and the phase of an internal clock output through a clock synchronizing unit, and of accurately synchronizing the internal clock with the external clock.

According to an embodiment of the present invention, a clock synchronization apparatus includes: a delay-correcting circuit which receives an initial voltage, compares a phase of an external clock with a phase of an internal clock output from a clock synchronizing unit, generates a control signal for correcting the phase of the internal clock on the basis of a difference between the phases of the external clock and the internal clock, and supplies the control signal to a replica delay unit of the clock synchronizing unit.

According to another embodiment of the present invention, a clock synchronization apparatus includes: a clock synchronizing unit which receives an external clock, delays the external clock by a predetermined amount of time, and outputs the delayed clock as an internal clock synchronized with the external clock, according to the result of delay modeling performed by a replica delay unit; and a delay-correcting circuit which receives an initial voltage, receives the external clock and the internal clock output from the clock synchronizing unit, enables a pumping-up signal or a pumping-down signal on the basis of a difference between the phases of the external clock and the internal clock, performs voltage pumping on the basis of the pumping-up signal or the pumping-down signal, generates a control signal according to the result of the voltage pumping, and supplies the control signal to the replica delay unit.

According to still another embodiment of the invention, a clock synchronization apparatus includes: a replica delay unit which is coupled to a delay-correcting circuit, which compares a phase of an external clock with a phase of an internal clock output from a clock synchronizing unit and generates a control signal for correcting the phase of the internal clock on the basis of a difference between the phases of the external clock and the internal clock, wherein the replica delay unit includes: an inverter chain having a plurality of inverting elements coupled in series to each other, each receiving a clock signal delayed by the clock synchronizing unit by a predetermined time; a switching circuit unit having a plurality of switching circuits, each being coupled to an output terminal of the corresponding inverting element and being turned on or off by the control signal supplied from the delay-correcting circuit; and a delay element unit having a plurality of delay elements coupled between the plurality of switching circuits of the switching circuit unit and a ground terminal.

DESCRIPTION OF EXEMPLARY EMBODIMENTS

Hereinafter, embodiments of the present invention are described in detail below with reference to the accompanying drawings.

Figure 1:
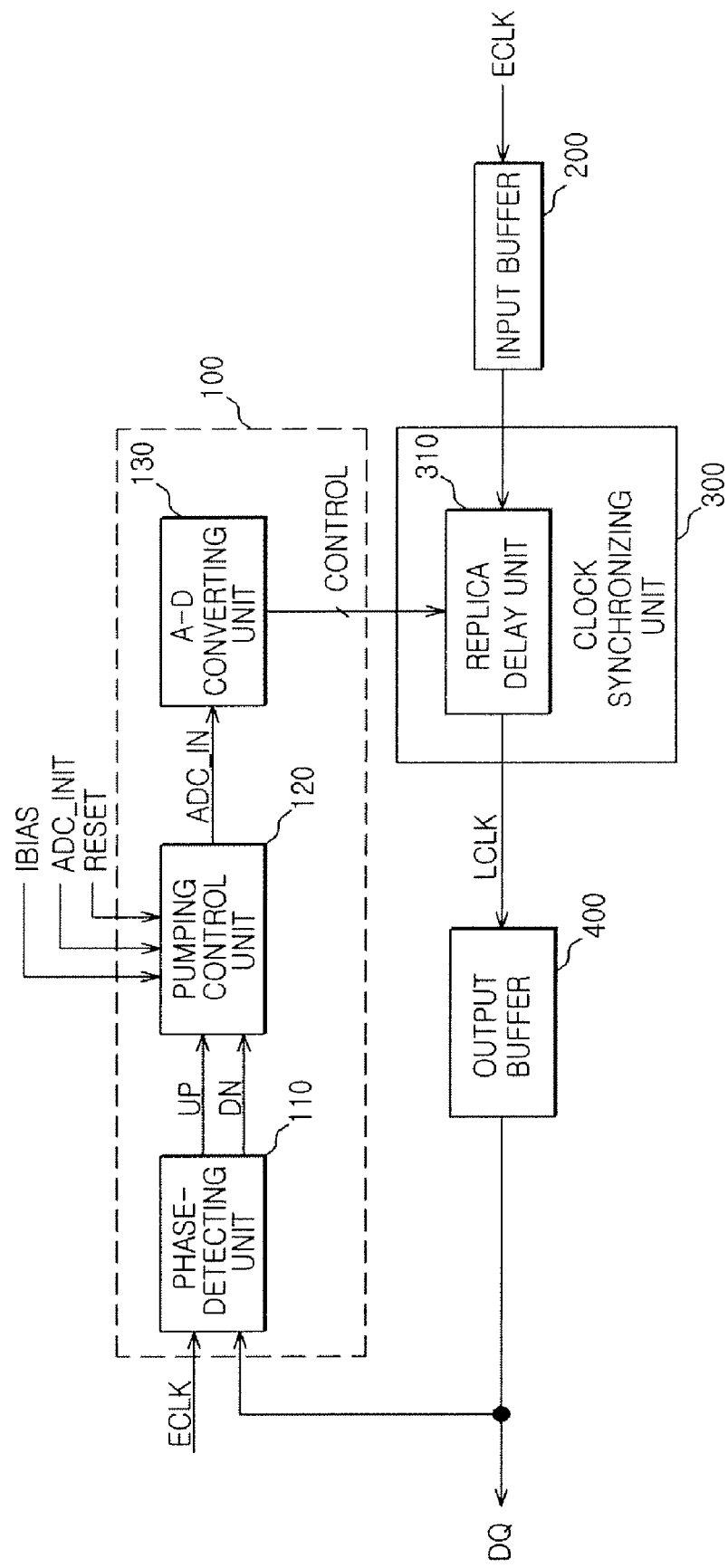
FIG. 1 is a block diagram illustrating a clock synchronization apparatus according to an embodiment of the present invention.

FIG. 1 is a block diagram illustrating a clock synchronization apparatus according to an embodiment of the present invention.

The clock synchronization apparatus of an embodiment of the present invention includes a delay-correcting circuit 100 for comparing the phase of an external clock ECLK and the phase of an internal clock LCLK output from a clock synchronizing unit 300 through an output buffer 400, generating a control signal CONTROL for correcting the phase of the internal clock LCLK on the basis of the difference between the phases of the two clocks, and supplying the control signal CONTROL to a replica delay unit 310 of the clock synchronizing unit 300.

When the phase of the internal clock LCLK is equal to the phase of the external clock ECLK, the delay-correcting circuit 100 outputs a control signal obtained by digitizing an output signal of a predetermined initial voltage ADC_INIT. On the other hand, when the phase of the internal clock LCLK leads the phase of the external clock ECLK, the delay-correcting circuit 100 pumps up the initial voltage ADC_INIT on the basis of a pumping-up signal UP for further delaying the internal clock LCLK by the difference between the phases of the external and internal clocks ECLK and LCLK, and outputs the control signal CONTROL obtained by digitizing an output potential based on the pumped-up voltage. When the phase of the external clock ECLK leads the phase of the internal clock LCLK, the delay-correcting circuit 100 pumps down the initial voltage ADC_INIT on the basis of a pumping-down signal DN for reducing the delay time of the internal clock LCLK by the difference between the phases of the external and internal clocks ECLK and LCLK, and outputs the control signal CONTROL obtained by digitizing an output potential based on the pumped-down voltage.

The pumping-up signal UP and the pumping-down signal DN may be continuously generated according to a burst length.

The replica delay unit 310 controls a plurality of switches provided therein on the basis of the control signal CONTROL received from the delay-correcting circuit 100 to increase or decrease the delay time with respect to the internal clock LCLK.

Meanwhile, the clock synchronizing unit 300, for example, receives a clock from an input buffer 200, outputs an internal clock delayed by the control of a phase-detecting unit, increases or decreases the delay time of the internal clock in the replica delay unit 310, and outputs the delayed internal clock. Further, the phase of the output signal of the replica delay unit 310 is compared with the phase of the clock received from the input buffer 200 in order for phase synchronization.

The above-mentioned operation is described in detail below.

The external clock ECLK is input to the clock synchronizing unit 300, such as DLL or PLL, through the input buffer 200. Then, the clock synchronizing unit 300 outputs the internal clock LCLK synchronized with the external clock to an output pad DQ through the output buffer 400.

The delay-correcting circuit 100 compares the phase of the external clock ECLK with the phase of the internal clock LCLK output from the output buffer 400 and generates the pumping-up or pumping-down signal UP or DN according to the difference between the phases of the two clocks. Then, the delay-correcting circuit 100 performs voltage pumping on the basis of the pumping-up or pumping-down signal UP or DN and supplies to the replica delay unit 310 the control signal CONTROL generated according to the result of the voltage pumping. The replica delay unit 310 increases or decreases the delay time of the internal clock on the basis of the control signal CONTROL to synchronize the internal clock LCLK with the external clock ECLK.

The delay-correcting circuit 100 includes: a phase-detecting unit 110 which receives the external clock ECLK and the internal clock LCLK, compares the phases of the two clocks, and outputs the pumping-up signal UP or the pumping-down signal DN; according to a result of comparing the two clocks, a pumping control unit 120 which charges or discharges an initial voltage in response to the pumping-up signal UP or the pumping-down signal DN output from the phase-detecting unit 110 and outputs a pumping signal ADC_IN; and an A-D (analog-to-digital) converting unit 130 which receives the pumping signal ADC_IN output from the pumping control unit 120, converts the received signal into the control signal CONTROL, and supplies the control signal CONTROL to the replica delay unit 310.

The A-D converting unit 130 converts the analog signal ADC_IN into the control signal CONTROL having a predetermined number of bits and outputs the control signal. As the number of bits of the control signal CONTROL increases, there is an advantage in that the difference between the phases of the corrected internal and external clocks becomes closer to zero. However, in this case, there is a disadvantage in that the area of the circuits may increase. Thus, the designer can arbitrarily determine the number of bits of the control signal CONTROL according to the delay correction level of the internal clock.

The replica delay unit 310 includes a plurality of switches each of which is turned on or off in response to the control signal CONTROL, and increases or decreases the delay time of the internal clock on the basis of the number of switches which are turned on or off in response to the control signal CONTROL.

Figure 2A:
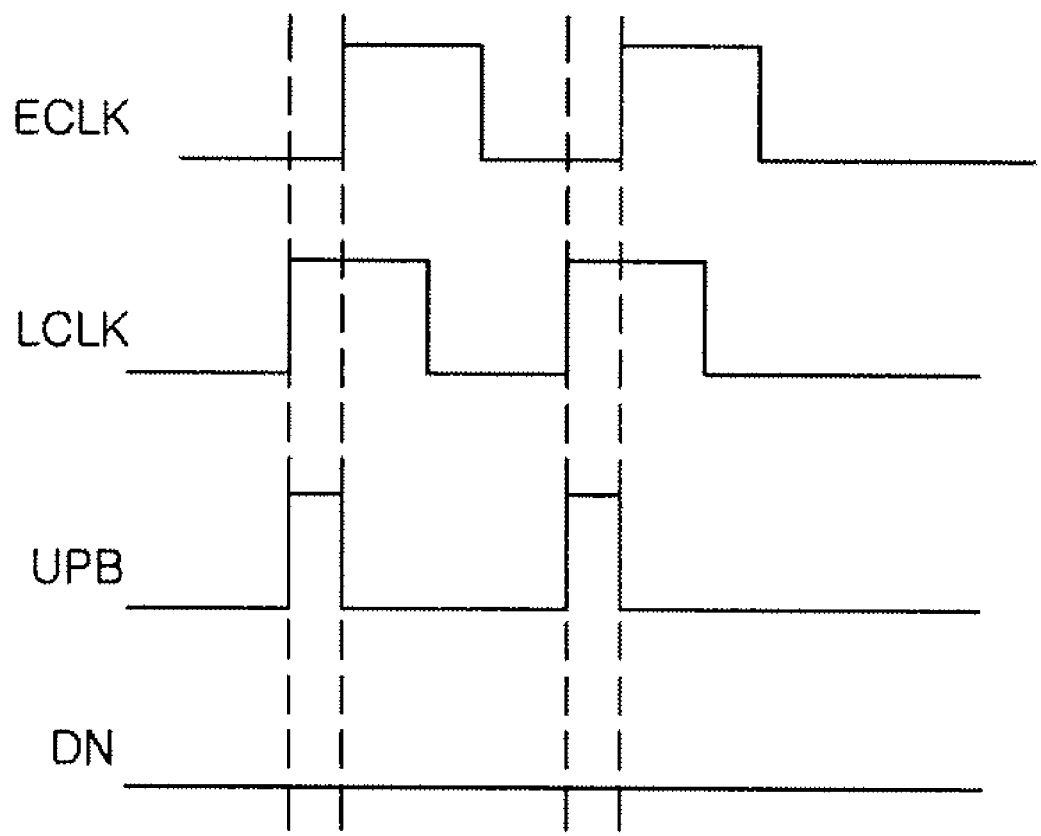
FIGS. 2A to 2C are timing charts illustrating the operation of a phase-detecting unit shown in FIG. 1.
Figure 2B:
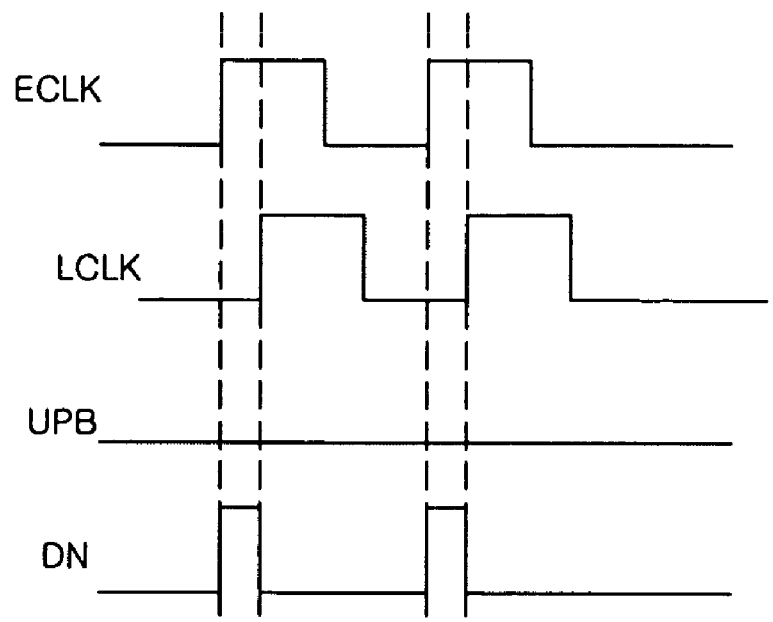
Figure 2C:
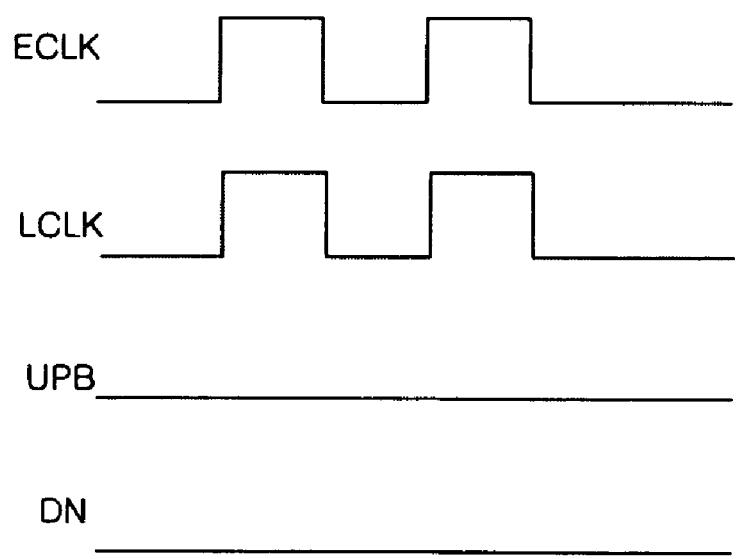

FIGS. 2A to 2C are timing charts illustrating the operation of the phase-detecting unit.

As shown in FIG. 2A, when the phase of the internal clock LCLK leads the phase of the external clock ECLK, an inversion signal UPB of the pumping-up signal is enabled in synchronization with the internal clock LCLK, and the pumping-down signal DN is disabled. Therefore, whenever the pumping-up signal UP is enabled, the pumping control unit 120 pumps up the initial voltage ADC_INIT, and outputs the pumped up initial voltage ADC_INIT, as the pumping signal ADC_IN.

As shown in FIG. 2B, when the phase of the external clock ECLK leads the phase of the internal clock LCLK, the pumping-down signal DN is enabled in synchronization with the external clock ECLK, and the inversion signal UPB of the pumping-up signal is disabled. Therefore, whenever the pumping-down signal DN is enabled, the pumping control unit 120 pumps down the initial voltage ADC_INIT, and outputs the pumped down initial voltage ADC_INIT as the pumping signal ADC_IN.

As shown in FIG. 2C, when the phases of the external clock ECLK and the internal clock LCLK are equal to each other, both the inversion signal UPB of the pumping-up signal and the pumping-down signal DN are disabled, so that the pumping control unit 120 outputs an output potential caused by the initial voltage ADC_INIT as the pumping signal ADC_IN, without performing a pumping-up operation or a pumping-down operation.

Figure 3:
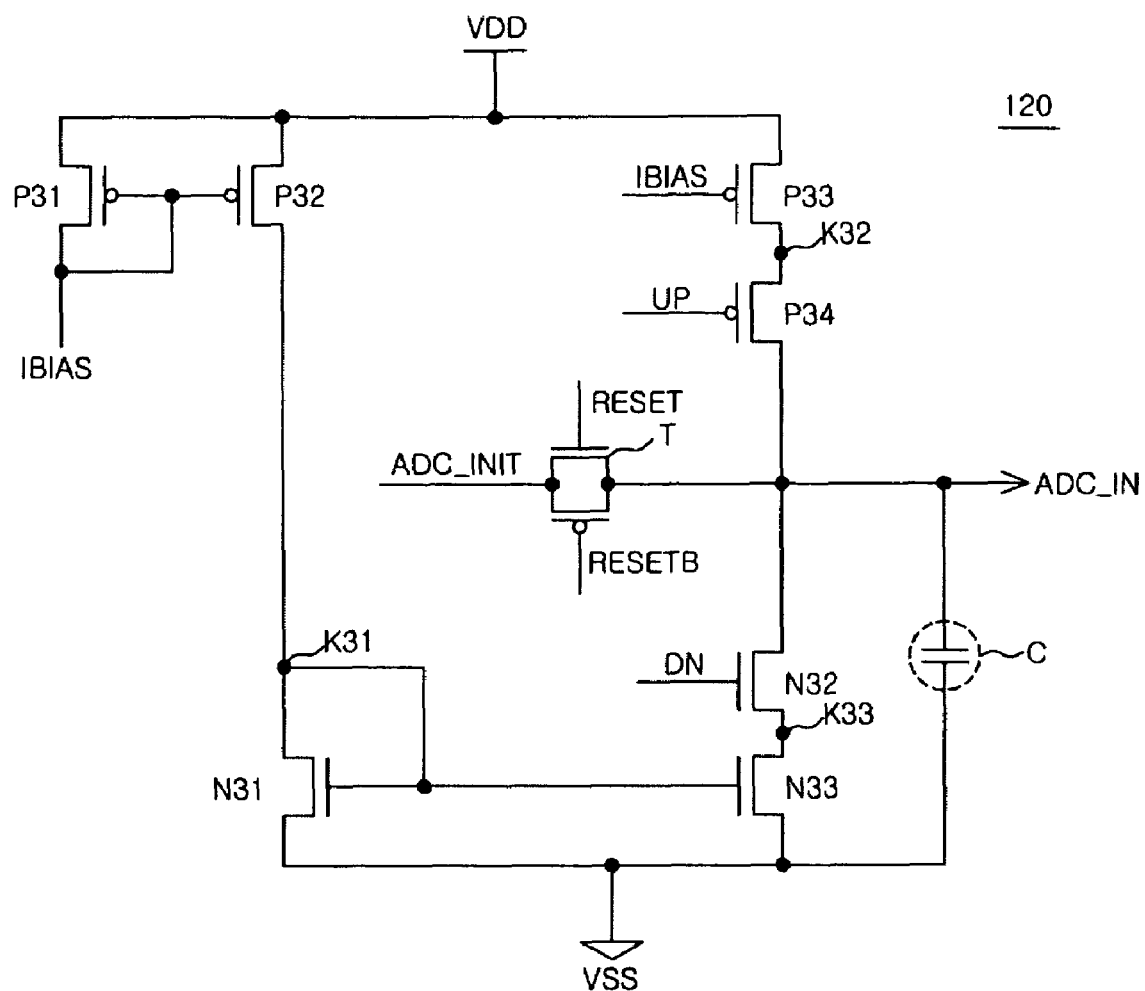
FIG. 3 is a detailed circuit diagram illustrating a pumping control unit shown in FIG. 1.

FIG. 3 is a detailed circuit diagram illustrating the structure of the pumping control unit shown in FIG. 1.

When both the pumping-up signal UP and the pumping-down signal DN are disabled, that is, when the phases of the internal clock LCLK and the external clock ECLK are equal to each other, the pumping control unit 120 charges the initial voltage ADC_INIT by the control of a reset signal RESET and outputs the voltage to an output terminal for the pumping signal ADC_IN. When the pumping-up signal UP is enabled and the pumping-down signal DN is disabled, that is, when the phase of the internal clock LCLK leads the phase of the external clock ECLK, the pumping control unit 120 pumps up the initial voltage ADC_INIT by the control of the reset signal RESET and outputs the pumped-up voltage to the output terminal for the pumping signal ADC_IN. When the pumping-up signal UP is disabled and the pumping-down signal DN is enabled, that is, when the phase of the external clock ECLK leads the phase of the internal clock LCLK, the pumping control unit 120 pumps down the initial voltage ADC_INIT by the control of the reset signal RESET and outputs the pumped-down voltage to the output terminal for the pumping signal ADC_IN.

As described in FIG. 3, the pumping control unit 120 includes: a first MOS transistor P31 which is connected between a power supply voltage VDD terminal and an input terminal for a bias voltage IBIAS and is driven by the bias signal IBIAS; a second MOS transistor P32 which is connected between the power supply voltage VDD terminal and a first node K31 and is driven by the bias signal IBIAS; a third MOS transistor P33 which is connected between the power supply voltage VDD terminal and a second node K32 and is driven by the bias signal IBIAS; a fourth MOS transistor P34 which is connected between the second node K32 and the output terminal for the pumping signal ADC_IN and is driven by the pumping-up signal UP; a transmission gate T which is connected between an input terminal for the initial voltage ADC_INIT and the output terminal for the pumping signal ADC_IN and is driven by the reset signal RESET; a fifth MOS transistor N31 which is connected between the first node K31 and a ground terminal VSS and is driven by a signal applied to the first node K31; a sixth MOS transistor N32 which is connected between the output terminal for the pumping signal ADC_IN and a third node K33 and is driven by the pumping-down signal DN; a seventh MOS transistor N33 which is connected between the third node K33 and the ground terminal VSS and is driven by the signal applied to the first node K31; and a capacitor C which is connected between the output terminal for the pumping signal ADC_IN and the ground terminal VSS and charges or discharges a voltage applied to the output terminal for the pumping signal ADC_IN.

Preferably, the first to fourth MOS transistors P31 to P34 are composed of PMOS transistors, and the fifth to seventh transistors N31 to N33 are composed of NMOS transistors.

When both the pumping-up signal UP and the pumping-down signal DN are disabled after the bias signal IBIAS is enabled and the reset signal RESET is enabled, the potential charged by the initial voltage ADC_INIT at capacitor C is output to the output terminal for the pumping signal ADC_IN, and, for example, the initial voltage ADC_INIT is set to half the power supply voltage VDD. When the phases of the internal clock LCLK and the external clock ECLK are equal to each other, the voltage of the capacitor C is maintained at a predetermined level.

The reason is as follows: the pumping control unit 120 should raise or lower the initial voltage ADC_INIT on the basis of the pumping-up signal UP or the pumping-down signal DN; however, when the charge value of the capacitor C is zero, the voltage is not lowered.

In this state, when the pumping-up signal UP is enabled, the first to fourth MOS transistors P31 to P34 and the fifth and seventh MOS transistors N31 and N33 are turned on, but the sixth MOS transistor N32 is turned off, which causes the initial voltage ADC_INIT plus the power supply voltage VDD to be applied to the capacitor C. This pumping-up operation is repeatedly performed whenever the pumping-up signal UP is enabled, and the pumped-up voltage charged in the capacitor C is output through the output terminal for the pumping signal ADC_IN.

Figure 4:
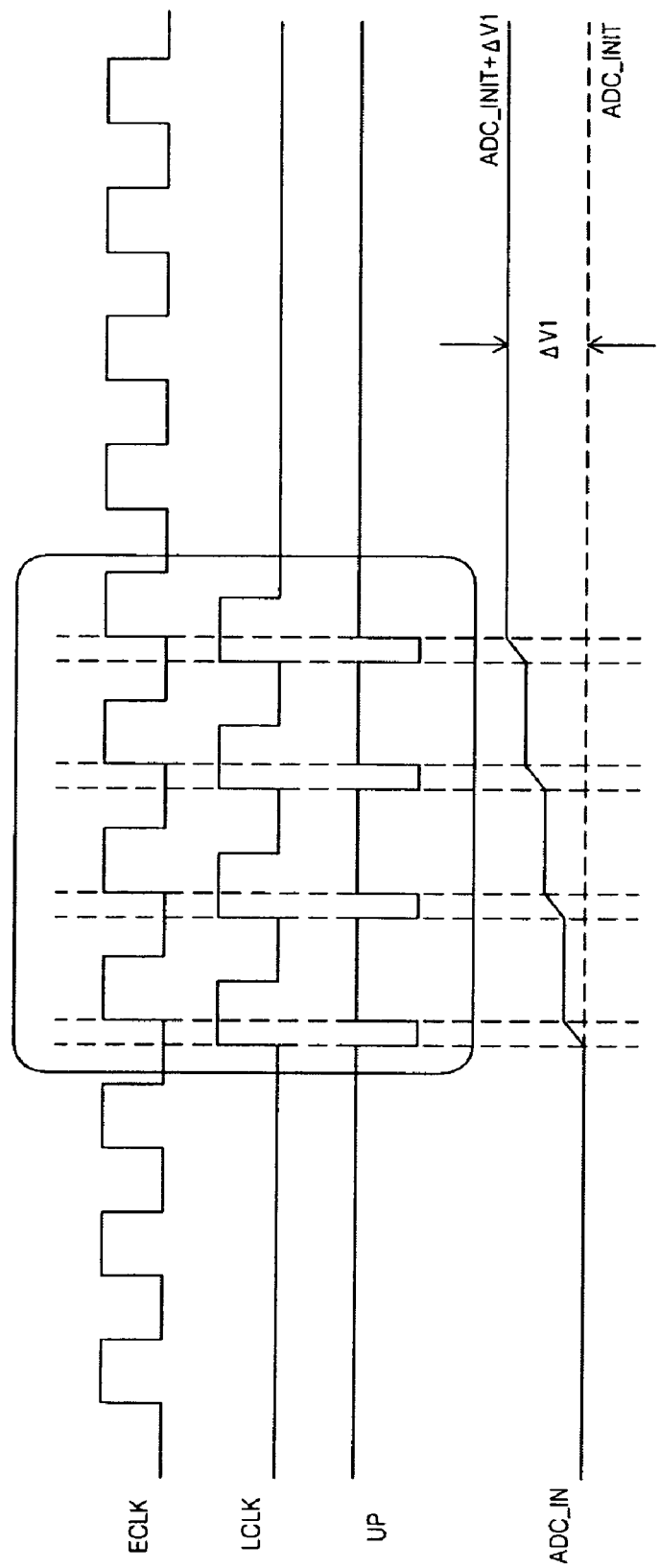
FIG. 4 is a timing chart illustrating a pumping-up operation of the clock synchronization apparatus according to an embodiment of the present invention.

FIG. 4 is a timing chart illustrating a pumping-up operation in the delay-correcting circuit according to an embodiment of the present invention, where the burst length is 4.

As shown in FIG. 4, when the phase of the internal clock LCLK leads the phase of the external clock ECLK, the pumping-up signal UP is output from the phase-detecting unit 110, and then pumping-up is performed by the capacitor C of the pumping control unit 120 shown in FIG. 3, so that the potential of the pumping signal ADC_IN applied to the output terminal rises from the initial voltage ADC_INIT whenever the pumping-up signal UP is enabled. Consequently, the final potential of the pumping signal ADC_IN which is pumped up by the burst length rises from the initial voltage ADC_INIT by $\Delta V1$ (ADC_IN=ADC_INIT+$\Delta V1$).

Meanwhile, when the pumping-down signal DN is enabled in the pumping control unit 120, the MOS transistors P31, P32, P33, N31, N32, and N33 except for the fourth MOS transistor P34 are turned on, which causes the voltage of the capacitor C to be applied to the ground terminal VSS. As a result, the potential of the output terminal ADC_IN is lowered from the initial voltage ADC_INIT. This operation is performed whenever the pumping-down signal DN is enabled, and thus the final potential of the pumping signal ADC_IN is lowered from the initial voltage ADC_INIT by $\Delta V2$ (ADC_IN=ADC_INIT−$\Delta V2$).

Figure 5:
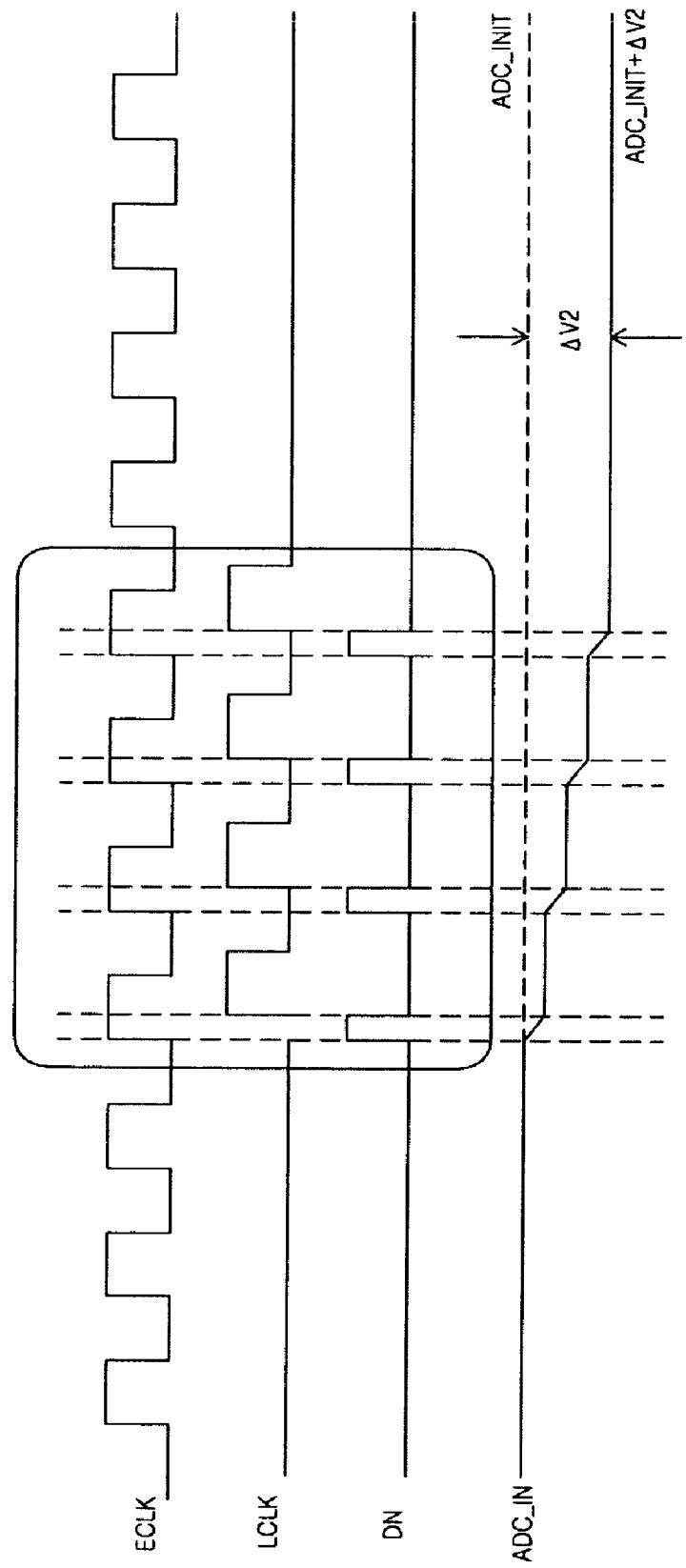
FIG. 5 is a timing chart illustrating a pumping-down operation of the clock synchronization apparatus according to an embodiment of the present invention.

FIG. 5 is a timing chart illustrating a pumping-down operation of the delay-correcting circuit according to an embodiment of the present invention.

As described in FIG. 5, when the burst length is 4, the capacitor C is discharged whenever the pumping-down signal DN is enabled, and thus the output potential of the capacitor C is gradually lowered. As a result, the potential of the pumping signal ADC_IN is lowered from the initial voltage ADC_INIT by $\Delta V2$.

Figure 6:
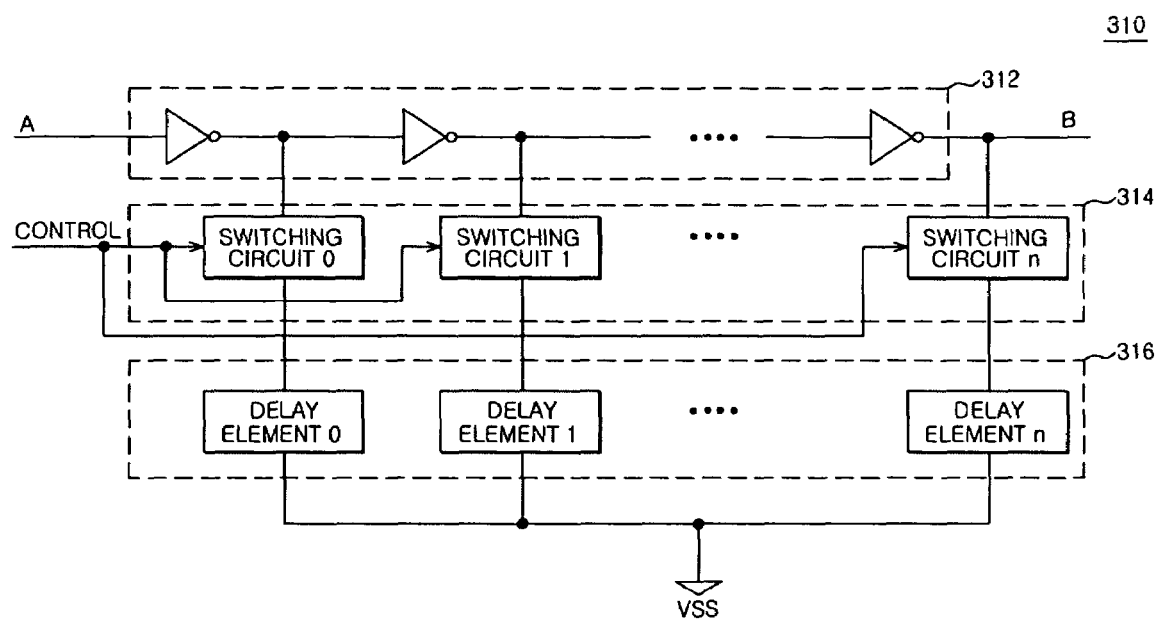
FIG. 6 is a diagram illustrating the detailed structure of a replica delay unit shown in FIG. 1.

FIG. 6 is a diagram illustrating the detailed structure of the replica delay unit shown in FIG. 1.

As shown in FIG. 6, the replica delay unit 310 includes an inverter chain 312 having a plurality of inverting elements coupled in series to each other, each receiving a clock signal A delayed by a predetermined amount of time by the clock synchronizing unit 300, a switching circuit unit 314 having a plurality of switching circuits, each being coupled to an output terminal of a corresponding inverting element of the inverter chain 312 and being turned on or off in response to the control signal CONTROL supplied from the A-D converting unit 130, and a delay element unit 316 having a plurality of delay elements, each being coupled between a corresponding switching circuit 314 and the ground terminal VSS.

Preferably, the switching circuits of the switching circuit unit 314 and the delay elements of the delay element unit 316 are provided such that the number thereof corresponds to the number of bits of the control signal CONTROL. The switching circuits may be composed of MOS transistors.

When both the pumping-up signal UP and the pumping-down signal DN are in a disable state, a predetermined number of switching circuits of the switching circuit unit 314 are turned on by the control signal CONTROL obtained by digitizing the pumping signal ADC_IN based on the initial voltage ADC_INIT.

When the pumping-up signal UP is enabled, that is, when the phase of the internal clock LCLK leads the phase of the external clock ECLK and thus the delay time of the internal clock LCLK needs to increase, the switching circuits of the switching circuit unit 314, which are in an off state, are turned on by the control signal CONTROL, and the input signal A is delayed by a predetermined time and is then output through an output terminal B to a corresponding element of a DLL (for example, a phase-comparing unit of the DLL, which is not shown).

On the other hand, when the pumping-down signal DN is enabled, that is, when the phase of the external clock ECLK leads the phase of the internal clock LCLK and thus the delay time of the internal clock LCLK needs to decrease, the switching circuits of the switching circuit unit 314, which are in an on state, are turned off by the control signal CONTROL. Then, the input signal A is output to the output terminal B with a decreased delay time.

The clock synchronization apparatus can be used for various systems requiring clock synchronization, as well as semiconductor memory apparatuses. In particular, when the replica delay unit is used to remove a data flight time, the clock synchronization apparatus of the invention can be applied to remove skew resulting from the modeling of the replica delay unit.

It will be understood by those skilled in the art that various modifications and changes to the invention can be made without departing from the scope and spirit of the invention. Therefore, it should be understood that the above-described embodiment is not restrictive, but illustrative in all aspects. It should be understood that the scope of the invention is defined by the following claims rather than by the detailed description of the invention, and the invention covers changes and modifications derived from the scope and spirit of the appended claims and their equivalents.

As described above, according to the clock synchronization apparatus the disclosed embodiment of invention, it is possible to accurately synchronize an internal clock with an external clock by increasing or decreasing the delay time of a replica delay unit on the basis of a control signal generated by the difference between the phases of the external clock and the internal clock.

Further, it is possible to synchronize an internal clock without additionally providing a large number of delay elements in a replica delay unit in order to minutely adjust the phase of the internal clock, and thus to reduce the area of a circuit. In addition, since the difference between phases is corrected in the clock synchronization apparatus, it is possible to decrease the time required to perform clock synchronization and correction.

What is claimed is:

1. A clock synchronization apparatus comprising:
 a delay-correcting circuit configured to receive an initial voltage, compare a phase of an external clock with a phase of an internal clock output from a clock synchronizing unit, generate a control signal for correcting the phase of the internal clock on the basis of a difference between the phases of the external clock and the internal clock, and supply the control signal to a replica delay unit of the clock synchronizing unit,
 wherein the delay-correcting circuit includes:
 a phase-detecting unit configured to receive the external clock and the internal clock, compare the phases of the internal and external clocks, and generate a pumping-up signal or a pumping-down signal according to a result of the comparison of the internal and external clocks;
 a pumping control unit configured to charge or discharge the initial voltage in response to the pumping-up signal or the pumping-down signal output from the phase-detecting unit and output the pumping signal from an output terminal; and
 an analog-to-digital (A-D) converting unit configured to receive the pumping signal output from the pumping control unit, convert the pumping signal into the control signal, and output the control signal to the replica delay unit,
 wherein the pumping control unit includes:
 a first MOS transistor coupled between a power supply voltage terminal and a bias signal input terminal and driven by a bias signal;
 a second MOS transistor coupled between the power supply voltage terminal and a first node and driven by the bias signal;
 a third MOS transistor coupled between the power supply voltage terminal and a second node and driven by the bias signal;
 a fourth MOS transistor coupled between the second node and the output terminal for the pumping signal and driven by the pumping-up signal;
 a transmission gate coupled between an input terminal for the initial voltage and the output terminal for the pumping signal and driven by a reset signal;
 a fifth MOS transistor coupled between the first node and a ground terminal and driven by a signal applied to the first node;
 a sixth MOS transistor coupled between the output terminal for the pumping signal and a third node and driven by the pumping-down signal;
 a seventh MOS transistor coupled between the third node and the ground terminal and driven by a signal supplied to the first node; and
 a capacitor coupled between the output terminal for the pumping signal and the ground terminal and configured to charge or discharge a voltage applied to the output terminal for the pumping signal.

2. The clock synchronization apparatus of claim 1, wherein, the delay-correcting circuit is configured to generate the control signal by digitizing an output potential based on the initial voltage when the phases of the internal clock and the external clock are equal to each other.

3. The clock synchronization apparatus of claim 1, wherein, the delay-correcting circuit is configured to enable the pumping-up signal, pump up the initial voltage on the basis of the pumping-up signal, and output the control signal obtained by digitizing an output potential based on the pumped-up voltage when the phase of the internal clock leads the phase of the external clock.

4. The clock synchronization apparatus of claim 3, wherein the pumping-up signal and the pumping-down signal are enabled by the number of times corresponding to a burst length.

5. The clock synchronization apparatus of claim 1,
wherein, the delay-correcting circuit is configured to enable the pumping-down signal, pump down the initial voltage on the basis of the pumping-down signal, and output the control signal obtained by digitizing an output potential based on the pumped-down voltage when the phase of the external clock leads the phase of the internal clock.

6. The clock synchronization apparatus of claim 5,
wherein the pumping-up signal and the pumping-down signal are enabled by the number of times corresponding to a burst length.

7. The clock synchronization apparatus of claim 1,
wherein the replica delay unit includes a plurality of switches, each of which is configured to receive the internal clock signal and is turned on or off by the control signal, and
is configured to increase or decrease a delay time of the internal clock on the basis of a number of switches turned on or off by the control signal.

8. The clock synchronization apparatus of claim 7,
wherein the plurality of switches are MOS transistors driven by the control signal.

9. The clock synchronization apparatus of claim 1,
wherein the clock synchronizing unit is a delay-locked loop.

10. The clock synchronization apparatus of claim 1,
wherein the clock synchronizing unit is a phase-locked loop.

11. The clock synchronization apparatus of claim 1,
wherein the initial voltage is set to half the power supply voltage.

12. A clock synchronization apparatus comprising:
a clock synchronizing unit configured to receive an external clock, delay the external clock by a predetermined amount of delay time, and output the delayed clock as an internal clock synchronized with the external clock, according to the result of delay modeling performed by a replica delay unit; and
a delay-correcting circuit configured to receive an initial voltage, receive the external clock and the internal clock output from the clock synchronizing unit, enables a pumping-up signal or a pumping-down signal on the basis of a difference between phases of the external clock and the internal clock, perform voltage pumping on the basis of the pumping-up signal or the pumping-down signal, generate a control signal according to a result of the voltage pumping, and supply the control signal to the replica delay unit, wherein the delay-correcting circuit includes:
a phase-detecting unit configured to receive the external clock and the internal clock, compare the phases of the internal and external clocks, and generate the pumping-up signal or the pumping-down signal according to a result of the comparison of the internal and external clocks;
a pumping control unit configured to charge or discharge the initial voltage in response to the pumping-up signal or the pumping-down signal output from the phase-detecting unit and output the pumping signal from an output terminal; and
an analog-to-digital (A-D) converting unit configured to receive the pumping signal output from the pumping control unit, convert the pumping signal into the control signal, and output the control signal to the replica delay unit, wherein the pumping control unit includes:
a first MOS transistor coupled between a power supply voltage terminal and a bias signal input terminal and driven by a bias signal;
a second MOS transistor coupled between the power supply voltage terminal and a first node and driven by the bias signal;
a third MOS transistor coupled between the power supply voltage terminal and a second node and driven by the bias signal;
a fourth MOS transistor coupled between the second node and the output terminal for the pumping signal and driven by the pumping-up signal;
a transmission gate coupled between an input terminal for the initial voltage and the output terminal for the pumping signal and driven by a reset signal;
a fifth MOS transistor coupled between the first node and a ground terminal and driven by a signal applied to the first node;
a sixth MOS transistor coupled between the output terminal for the pumping signal and a third node and driven by the pumping-down signal;
a seventh MOS transistor coupled between the third node and the ground terminal and driven by a signal supplied to the first node; and
a capacitor coupled between the output terminal for the pumping signal and the ground terminal and configured to charge or discharge a voltage applied to the output terminal for the pumping signal.

13. The clock synchronization apparatus of claim 12,
wherein, the delay-correcting circuit is configured to enable the pumping-up signal when the phase of the internal clock leads the phase of the external clock.

14. The clock synchronization apparatus of claim 12,
wherein, the delay-correcting circuit is configured to enable the pumping-down signal when the phase of the external clock leads the phase of the internal clock.

15. The clock synchronization apparatus of claim 12,
wherein, the pumping control unit is configured to charge the initial voltage and output the charged initial voltage as the pumping signal when both the pumping-up signal and the pumping-down signal are disabled.

16. The clock synchronization apparatus of claim 12,
wherein, the pumping control unit is configured to pump up the initial voltage and output the pumped up initial voltage as the pumping signal when the pumping-up signal is enabled and the pumping-down signal is disabled.

17. The clock synchronization apparatus of claim 12,
wherein, the pumping control unit is configured to pump down the initial voltage and output the pumped down initial voltage as the pumping signal when the pumping-up signal is disabled and the pumping-down signal is enabled.

18. The clock synchronization apparatus of claim 12,
wherein the first to fourth MOS transistors are PMOS transistors.

19. The clock synchronization apparatus of claim 12,
wherein the fifth to seventh MOS transistors are NMOS transistors.

20. The clock synchronization apparatus of claim 12,
wherein the A-D converting unit is configured to convert an analog pumping signal output from the pumping control unit into a control signal having a predetermined number of bits and to output the control signal.

21. The clock synchronization apparatus of claim 12,
wherein the replica delay unit includes a plurality of switches each of which receives the internal clock signal and is turned on or off in response to the control signal, and
is configured to increase or decrease the delay time on the basis of the number of switches turned on or off in response to the control signal.

22. The clock synchronization apparatus of claim 21,
wherein the plurality of switches are MOS transistors driven by the control signal.

23. The clock synchronization apparatus of claim 12,
wherein the replica delay unit includes:
an inverter chain having a plurality of inverting elements coupled in series to each other, each configured to receive a clock signal delayed by a predetermined amount of time by the clock synchronizing unit as input and having an output terminal;
a switching circuit unit having a plurality of switching circuits, each coupled to the output terminal of a corresponding one of the inverting elements and being turned on or off in response to the control signal supplied from the A-D converter; and
a delay element unit having a plurality of delay elements, each being coupled between a corresponding one of the switching circuits and a ground terminal.

24. The clock synchronization apparatus of claim 23,
wherein a number of the switching circuits or the delay elements is equal to a number of bits of the control signal.

25. The clock synchronization apparatus of claim 23,
wherein, the replica delay unit is configured to turn on a predetermined number of switching circuits among the plurality of switching circuits of the switching circuit unit by the control signal when both the pumping-up signal and the pumping-down signal are disabled.

26. The clock synchronization apparatus of claim 25,
wherein, the replica delay unit is configured to turn on a predetermined number of switching circuits, which are in an off state, among the plurality of switching circuits of the switching circuit unit by the control signal when the pumping-up signal is enabled and the pumping-down signal is disabled.

27. The clock synchronization apparatus of claim 25,
wherein, the replica delay unit is configured to turn off a predetermined number of switching circuits, which are in an on state, among the plurality of switching circuits of the switching circuit unit by the control signal when the pumping-down signal is enabled and the pumping-up signal is disabled.

28. The clock synchronization apparatus of claim 12,
wherein the clock synchronizing unit is a delay-locked loop.

29. The clock synchronization apparatus of claim 12,
wherein the clock synchronizing unit is a phase-locked loop.

30. The clock synchronization apparatus of claim 12,
wherein the initial voltage is set to half the power supply voltage.

* * * * *